United States Patent
Kim et al.

(10) Patent No.: US 10,804,477 B2
(45) Date of Patent: Oct. 13, 2020

(54) FLEXIBLE DISPLAY DEVICE AND METHOD FOR MANUFACTURING THE SAME

(71) Applicant: Samsung Display Co., Ltd., Yongin-Si, Gyeonggi-Do (KR)

(72) Inventors: Seung Kim, Seongnam-si (KR); Junehyoung Park, Seoul (KR); Jeongwoo Park, Yongin-si (KR); Seungho Kim, Asan-si (KR); Hoikwan Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/205,695

(22) Filed: Nov. 30, 2018

(65) Prior Publication Data
US 2019/0173030 A1  Jun. 6, 2019

(30) Foreign Application Priority Data
Dec. 4, 2017 (KR) .................. 10-2017-0165410

(51) Int. Cl.
| H01L 51/00 | (2006.01) |
| H01L 27/32 | (2006.01) |
| H01L 51/52 | (2006.01) |
| H01L 51/56 | (2006.01) |
| B32B 17/06 | (2006.01) |

(Continued)

(52) U.S. Cl.
CPC .......... *H01L 51/0097* (2013.01); *B32B 7/12* (2013.01); *B32B 17/06* (2013.01); *B32B 37/12* (2013.01); *H01L 27/323* (2013.01); *H01L 27/3244* (2013.01); *H01L 51/524* (2013.01); *H01L 51/56* (2013.01); *B32B 2037/1253* (2013.01);

(Continued)

(58) Field of Classification Search
CPC ............ H01L 51/0097; H01L 27/3244; H01L 27/323; H01L 51/524; H01L 51/56; H01L 2251/5338; B32B 17/06; B32B 37/12; B32B 7/12; B32B 2266/057; B32B 2457/20; B32B 2037/1253
See application file for complete search history.

(56) References Cited

U.S. PATENT DOCUMENTS 9,051,493 B2  6/2015 Bower et al.
2013/0114219 A1* 5/2013 Garner .............. G02F 1/133308
361/750

(Continued)

FOREIGN PATENT DOCUMENTS

| KR | 1020150104180 A | 9/2015 |
| KR | 1020160006585 A | 1/2016 |

(Continued)

*Primary Examiner* — Su C Kim
(74) *Attorney, Agent, or Firm* — Cantor Colburn LLP

(57) ABSTRACT

A flexible display device, which has a bending area and a non-bending area, includes a display panel, and a window member disposed on the display panel and including a first glass substrate, a second glass substrate disposed opposite to the second glass substrate, and a bonding layer disposed between the first glass substrate and the second glass substrate. The bonding layer includes a first bonding part overlapping the bending area and a second bonding part overlapping the non-bending area and having a modulus greater than a modulus of the first bonding part.

19 Claims, 9 Drawing Sheets

(51) Int. Cl.
*B32B 37/12* (2006.01)
*B32B 7/12* (2006.01)

(52) U.S. Cl.
CPC ..... *B32B 2266/057* (2016.11); *B32B 2457/20* (2013.01); *H01L 2251/5338* (2013.01)

(56) References Cited

U.S. PATENT DOCUMENTS

| | | | |
|---|---|---|---|
| 2014/0120329 A1* | 5/2014 | Hu | B32B 27/308 |
| | | | 428/201 |
| 2015/0268697 A1* | 9/2015 | Nam | B32B 7/02 |
| | | | 428/157 |
| 2015/0336357 A1 | 11/2015 | Kang et al. | |
| 2016/0014881 A1 | 1/2016 | Shin et al. | |
| 2016/0311199 A1 | 10/2016 | Iwamoto et al. | |
| 2016/0338219 A1* | 11/2016 | Seo | G06F 1/1652 |
| 2017/0239771 A1 | 8/2017 | Park et al. | |
| 2018/0132371 A1 | 5/2018 | Yeum et al. | |
| 2019/0211168 A1* | 7/2019 | Thompson | B32B 7/06 |

FOREIGN PATENT DOCUMENTS

| | | | |
|---|---|---|---|
| KR | 1020160108295 A | 9/2016 | |
| KR | 1020170100104 A | 9/2017 | |
| KR | 1020180051695 A | 5/2018 | |
| KR | 1020180132201 A | 12/2018 | |

\* cited by examiner

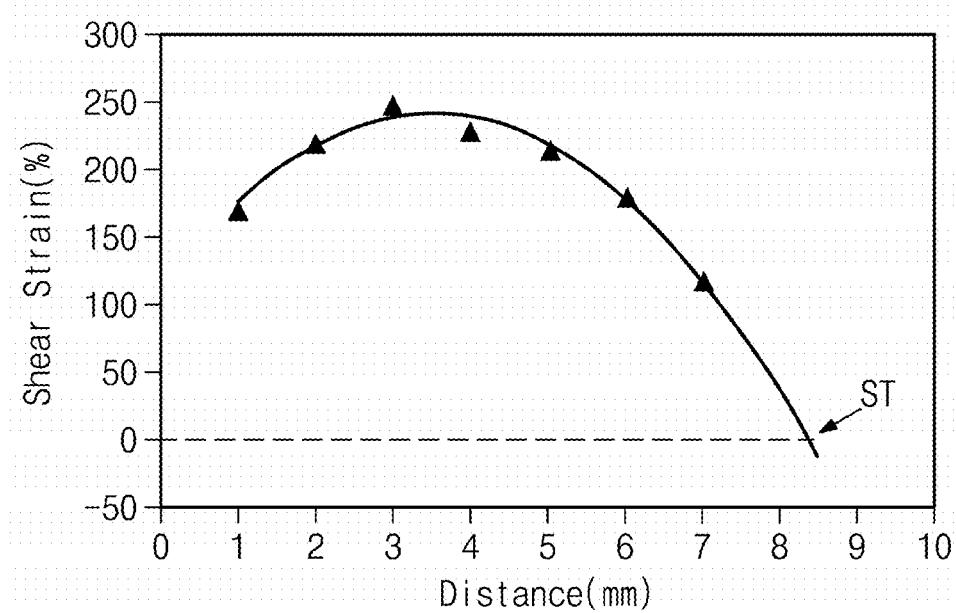

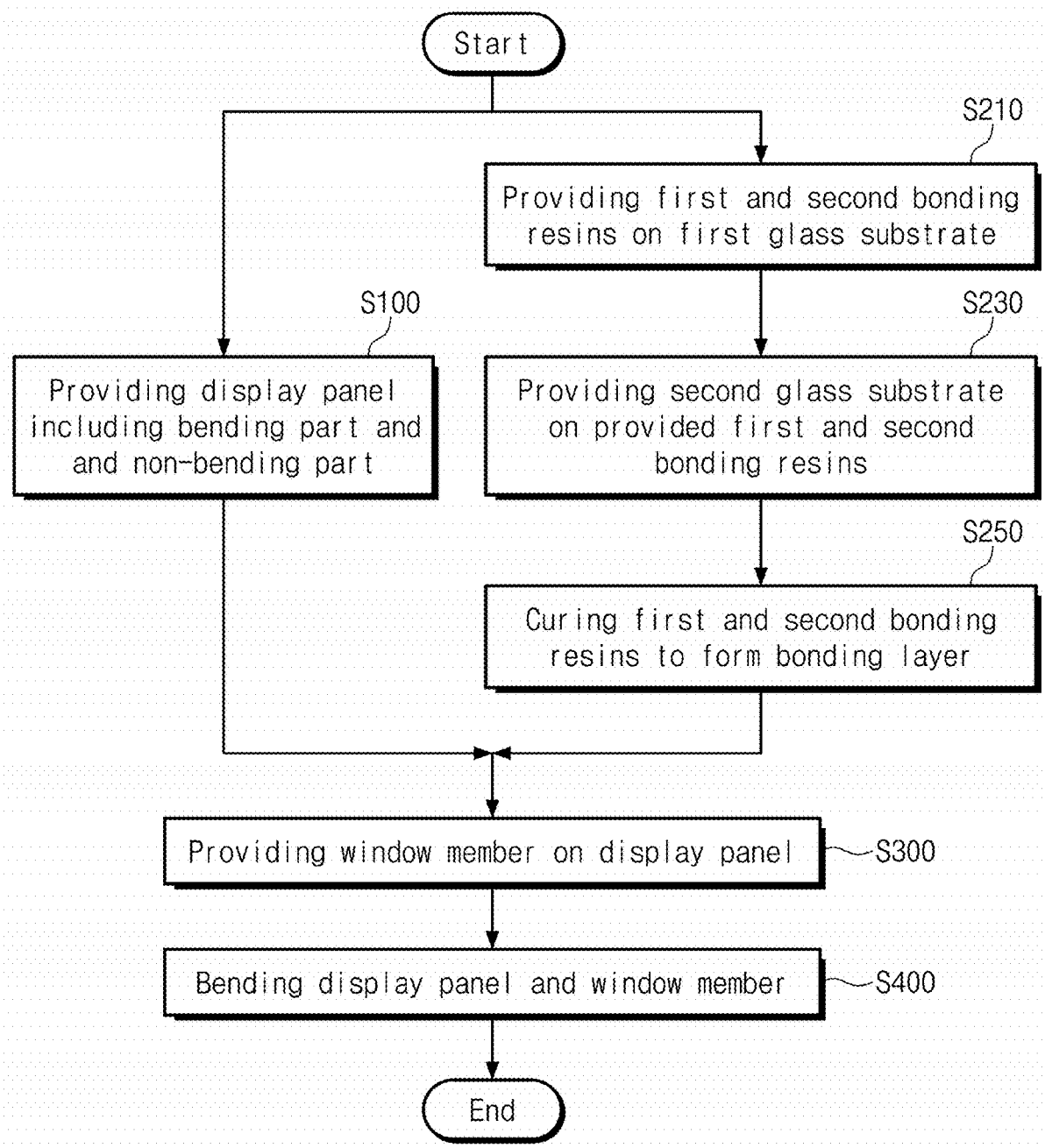

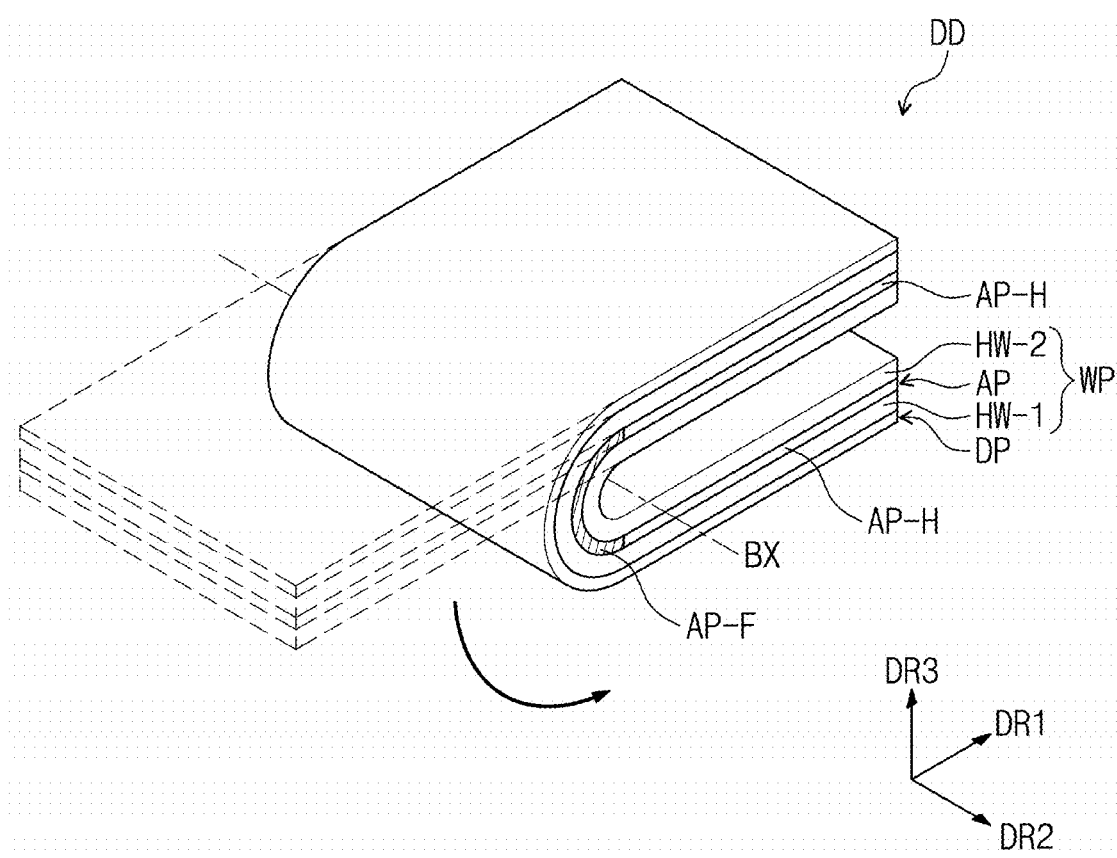

FLEXIBLE DISPLAY DEVICE AND METHOD FOR MANUFACTURING THE SAME

This application claims priority to Korean Patent Application No. 10-2017-0165410, filed on Dec. 4, 2017, and all the benefits accruing therefrom under 35 U.S.C. § 119, the content of which in its entirety is herein incorporated by reference.

BACKGROUND

1. Field

The disclosure herein relates to a flexible display device and a method for manufacturing the flexible display device, and more particularly, to a flexible display device including a window member having desired bending characteristics in a bending area and high impact resistance and a method for manufacturing the flexible display device.

2. Description of the Related Art

Various kinds of display device, which are widely used for multimedia devices such as televisions, mobile phones, tablet computers, navigations, and game consoles, have been developed. Particularly, in recent years, a flexible display device having characteristics allowing to be deformed in various shapes, e.g., bent or folded, has been developed.

When the flexible display device is deformed in shape, stress is applied to various members constituting the display device, and thus the various members of the display device are deformed. In such a flexible display device, a window member is typically provided to protect a display panel, and the window member is deformed according to the shape deformation of the display device.

SUMMARY

In a flexible display device, the window member is desired to have flexibility appropriate to realize the flexible display device and impact resistance sufficient for protecting the display panel against an external impact.

The disclosure provides a flexible display device including a window member having high impact resistance while minimizing bending stress in a bending area.

The disclosure also provides a method for manufacturing a flexible display device having both flexibility and impact resistance in a bending area by providing a bonding layer prepared by two types of bonding resins having properties different from each other.

In an embodiment of the invention, a flexible display device having a bending area and a non-bending area includes: a display panel; and a window member disposed on the display panel, where the window includes a first glass substrate, a second glass substrate disposed opposite to the first glass substrate, and a bonding layer disposed between the first glass substrate and the second glass substrate. In such an embodiment, the bonding layer includes: a first bonding part overlapping the bending area; and a second bonding part overlapping the non-bending area and having a modulus greater than a modulus of the first bonding part.

In an embodiment, the modulus of the first bonding part may be equal to or greater than about 0.1 megapascal (MPa) and equal to or less than about 100 MPa, and the modulus of the second bonding part may be greater than about 100 MPa and equal to or less than about 700 MPa.

In an embodiment, the bonding layer may include a polyurethane resin.

In an embodiment, the first bonding part may have a restoration rate equal to or greater than about 70% and equal to or less than about 100%.

In an embodiment, each of the first glass substrate and the second glass substrate may be a tempered glass substrate.

In an embodiment, each of the display panel and the window member may be bent to have a radius of curvature equal to or greater than about 1 millimeter (mm) and equal to or less than about 5 mm with respect to a bending axis extending in one direction.

In an embodiment, a width of the first bonding part in one direction perpendicular to an extension direction of the bending axis may satisfy the following inequation: $\pi R \leq W \leq 3 \times (\pi R)$, where R denotes the radius of curvature, and W denotes the width of the first bonding part.

In an embodiment, the display panel and the window member may be bent with respect to a bending axis in a first mode and spread in a second mode, and the window member may be disposed closer to the bending axis than the display panel in the first mode.

In an embodiment, the display panel and the window member may be bent with respect to a bending axis in a third mode and spread in a fourth mode, and the display panel may be disposed closer to the bending axis than the window member in the third mode.

In an embodiment, the first bonding part may include: a first sub-bonding portion overlapping the bending area; and a second sub-bonding portion extending from the first sub-bonding portion and overlapping the non-bending area.

In an embodiment, each of the first glass substrate and the second glass substrate may have a thickness equal to or greater than about 30 micrometers ($\mu m$) and equal to or less than about 50 $\mu m$.

In an embodiment, the bonding layer may have a thickness equal to or greater than about 5 $\mu m$ and equal to or less than about 30 $\mu m$.

In another embodiment of the invention, a flexible display device includes: a display panel including a bending part which is deformable into a bent shape with respect to a bending axis extending in one direction or has the bent shape; and a window member disposed on the display panel. In such an embodiment, the window member includes a first glass substrate, a bonding layer disposed on the first glass substrate, and a second glass substrate disposed on the bonding layer, and the bonding layer includes: a first bonding part overlapping the bending part and having a first modulus; and a second bonding part non-overlapping the bending part and having a second modulus greater than the first modulus.

In another embodiment of the invention, a method for manufacturing a flexible display device includes: providing a display panel including a bending part and a non-bending part; providing a window member including a first glass substrate, a second glass substrate disposed opposite to the second glass substrate, and a bonding layer disposed between the first glass substrate and the second glass substrate; and arranging the window member on the display panel. In such an embodiment, the providing the window member includes: providing a first bonding resin and a second bonding resin on the first glass substrate; arranging the second glass substrate on the first and second bonding resins; and curing the first and second bonding resins to form a bonding layer between the first glass substrate and the second glass substrate. In such an embodiment, the first bonding resin is provided in correspondence to the bending part, the second bonding resin is provided in correspondence to the non-bending part, each of the first bonding resin and the second bonding resin includes a polyol and a isocyanate, and the polyol in the first bonding resin has a mean molecular weight less than a mean molecular weight of the polyol in the second bonding resin.

In an embodiment, the mean molecular weight of the polyol contained in the first bonding resin may be equal to or greater than about 500 and equal to or less than about 1000.

In an embodiment, each of the first bonding resin and the second bonding resin provided on the first glass substrate may be in a pre-cured film type.

In an embodiment, the curing the first bonding resin and the second bonding resin to form the bonding layer may include thermally curing the first bonding resin and the second bonding resin between the first glass substrate and the second glass substrate.

In an embodiment, the curing the first bonding resin and the second bonding resin to form the bonding layer may include: curing the first bonding resin to form a first bonding part having a first modulus; and curing the second bonding resin to form a second bonding part having a second modulus greater than the first modulus.

In an embodiment, the first modulus may be equal to or greater than about 0.1 MPa and equal to or less than about 100 MPa, and the second modulus may be greater than about 100 MPa and equal to or less than about 700 MPa.

In an embodiment, the method may further include bending the display panel and the window member with respect to a bending axis extending in one direction.

BRIEF DESCRIPTION OF THE FIGURES

The above and other features of the disclosure will become readily apparent by reference to the following detailed description when considered in conjunction with the accompanying drawings, in which:

FIG. 6 is a graph showing a shear strain of a bonding layer versus a distance spaced from a bending area of the flexible display device according to an embodiment;

FIG. 7 is a flowchart showing a method for manufacturing the flexible display device according to an embodiment; and FIGS. 8A to 8E are schematic views sequentially illustrating processes of method for manufacturing the flexible display device according to an embodiment.

DETAILED DESCRIPTION

Figure 1:
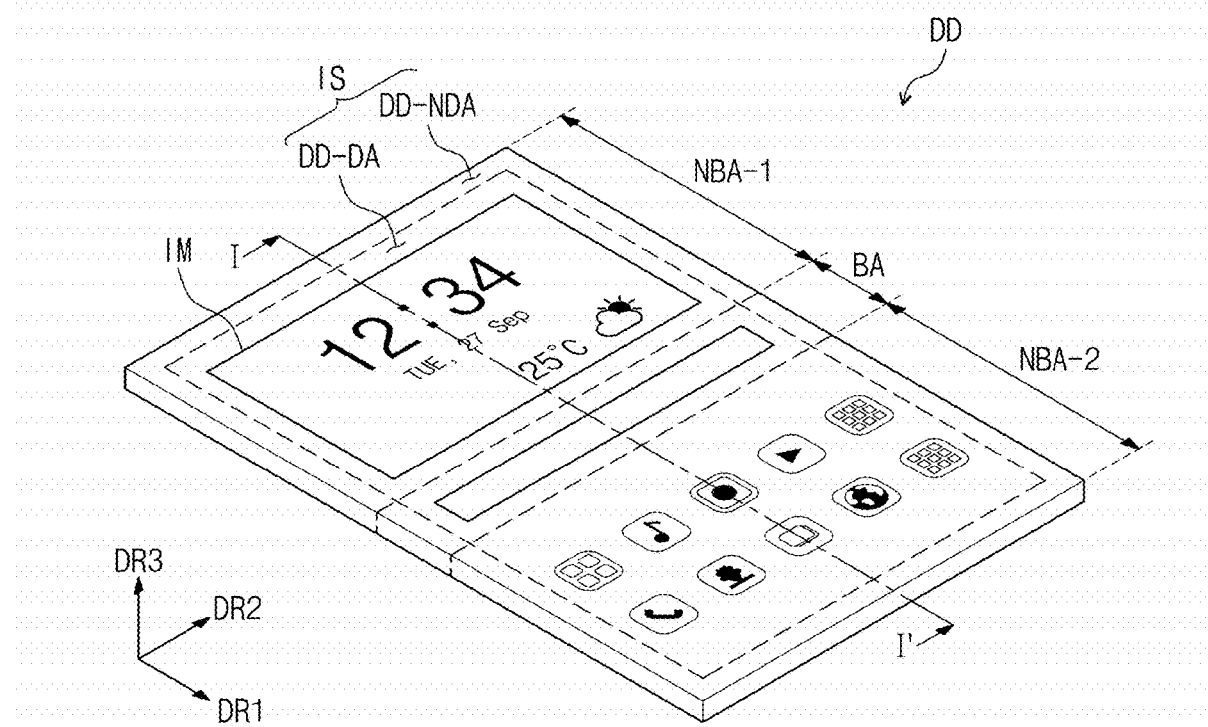
FIG. 1 is a perspective view of a flexible display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
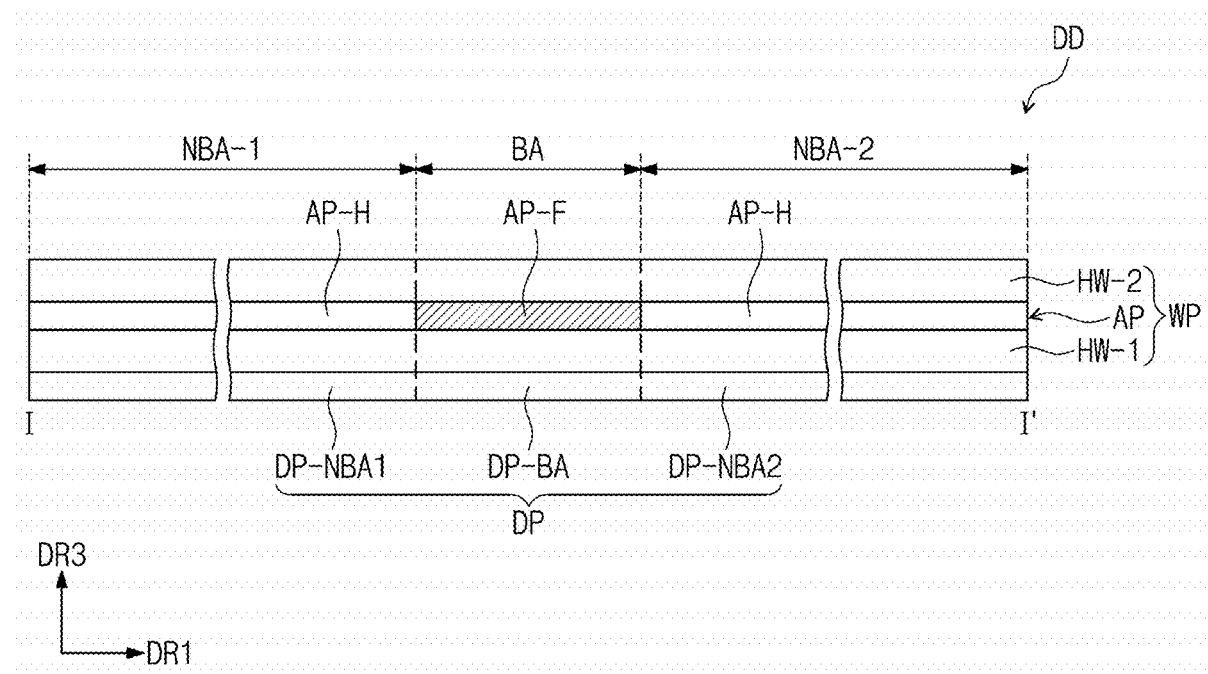
FIG. 2 is a cross-sectional view taken along line I-I' of FIG. 1.

FIG. 1 is a perspective view of a flexible display device according to an embodiment. FIG. 2 is a schematic cross-sectional view corresponding to a surface taken along line I-I' of FIG. 1.

Figure 3A:
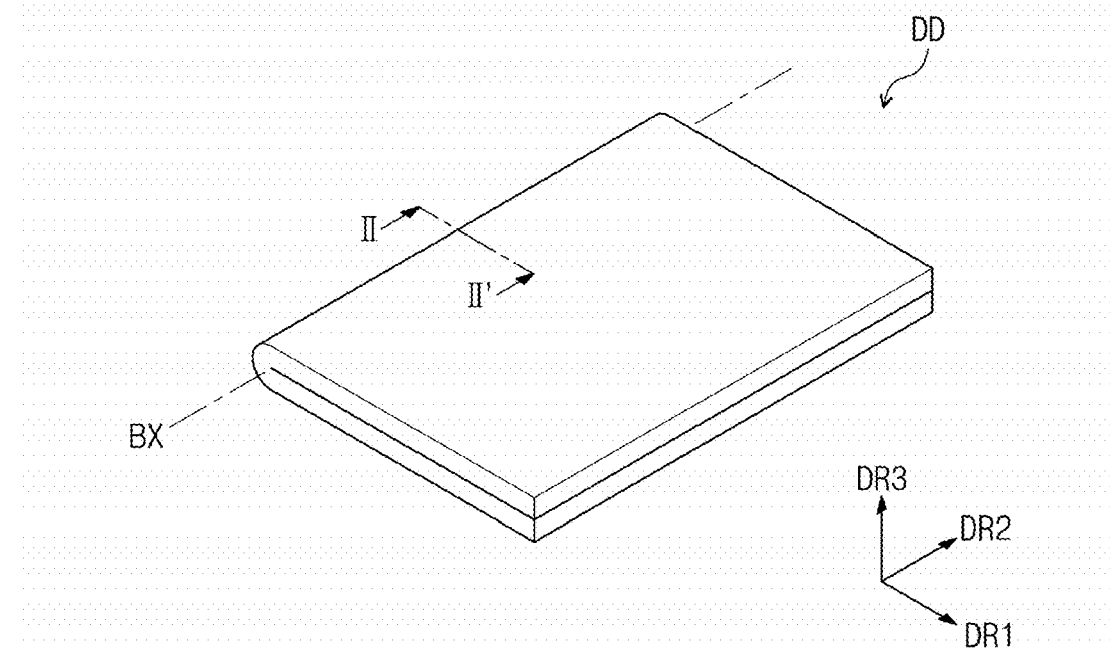
FIG. 3A is a perspective view illustrating an embodiment of the flexible display device in a bent state.
Figure 3B:
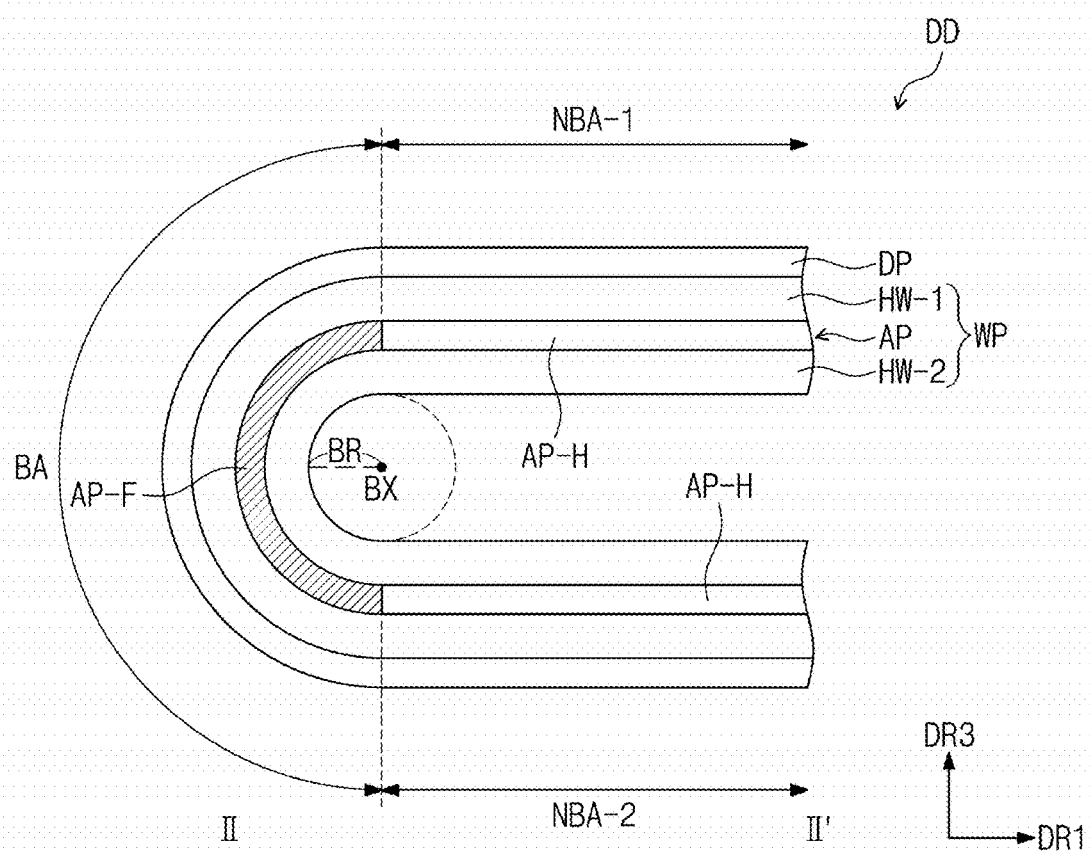
FIG. 3B is a cross-sectional view taken along line II-II' of FIG. 3A.
Figure 4A:
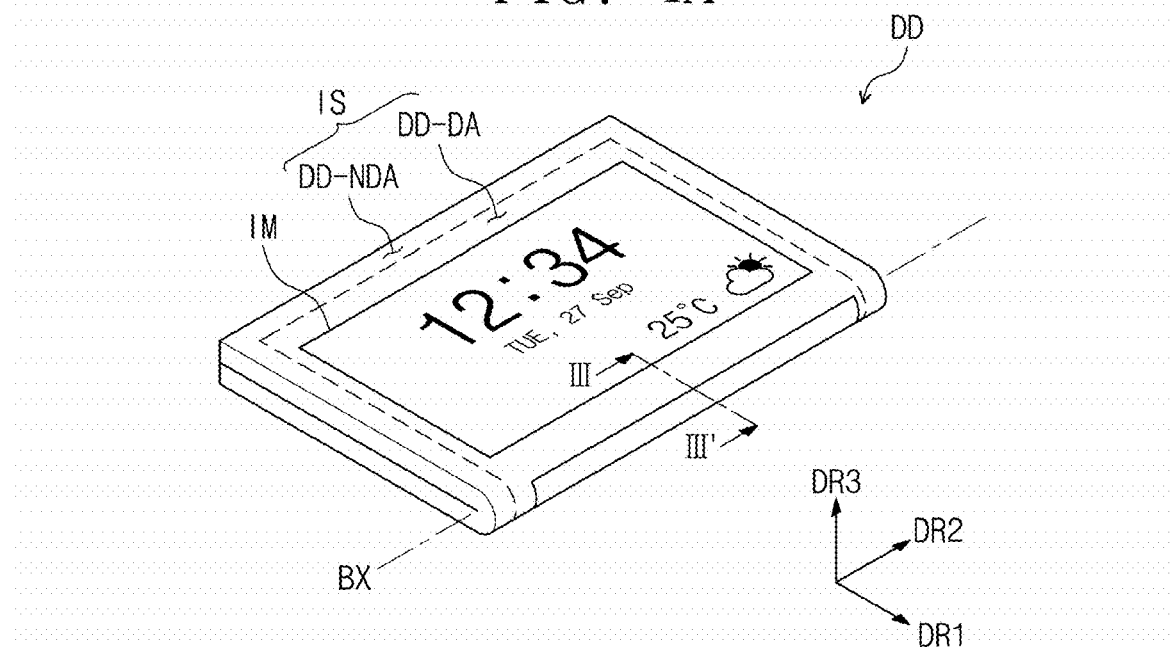
FIG. 4A is a perspective view illustrating an embodiment of the flexible display device in a bent state.
Figure 4B:
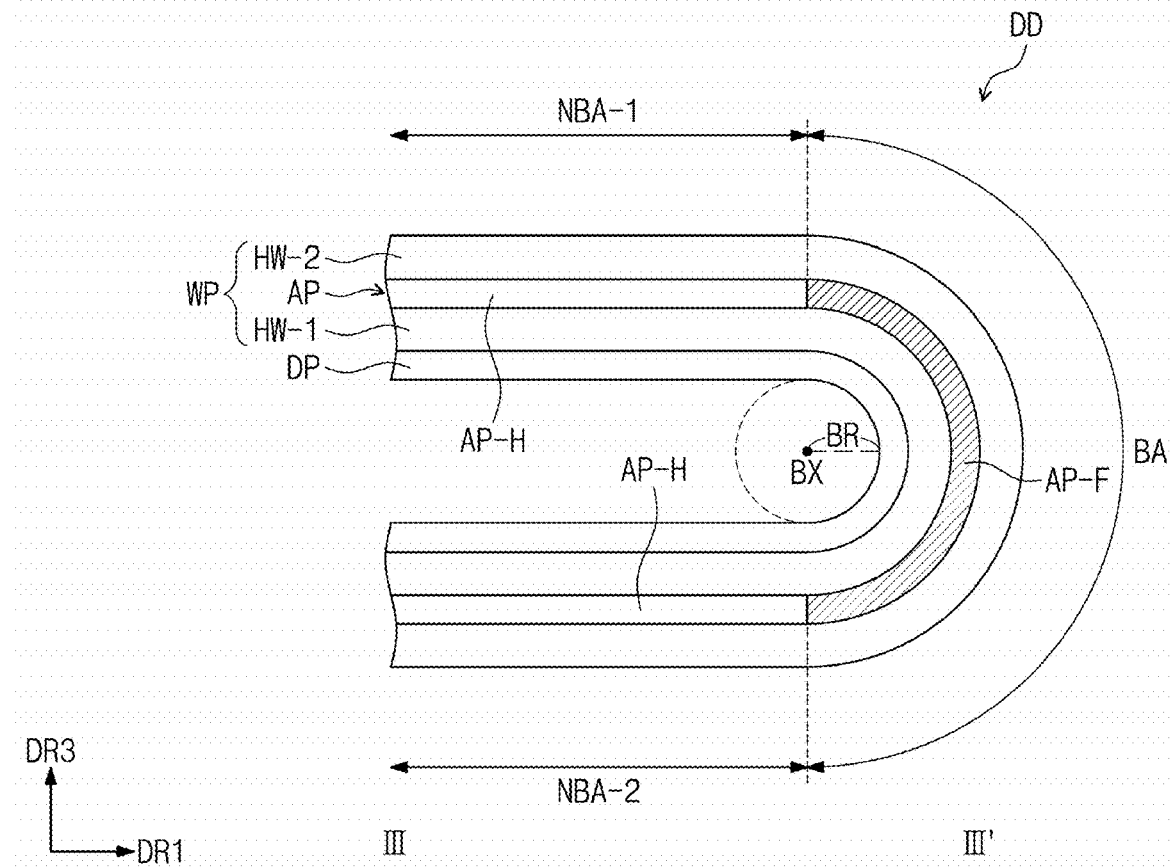
FIG. 4B is a cross-sectional view taken along line of FIG. 4A.

FIG. 1 is a schematic perspective view illustrating an embodiment of a flexible display device DD in an unfolded or spread state. Each of FIGS. 3A and 4A is a perspective view illustrating an embodiment of the flexible display device DD in a folded or bend state. FIGS. 3B and 4B are cross-sectional views illustrating portions of FIGS. 3A and 4A, respectively.

FIGS. 1 to 4B illustrate an embodiment of the flexible display device DD, where the flexible display device DD is a foldable display device. However, embodiments of the invention are not limited to the illustrated shape of the flexible display device DD in FIGS. 1 to 4B. In embodiments of the invention, the flexible display device DD may include a display device including a portion bent by a tensile force or a compressive force.

Referring to FIG. 1, in an embodiment of the flexible display device DD, a display surface IS, on which an image IM is displayed, is parallel to a surface defined by a first directional axis DR1 and a second directional axis DR2. A normal direction of the display surface IS, i.e., a thickness direction of the display device DD, is defined as a third directional axis DR3. A front surface (or a top surface) and a rear surface (or a bottom surface) of each of members are distinguished by the third directional axis DR3. However, directions indicated by the first to third directional axes DR1, DR2, and DR3 may be a relative concept and converted with respect to each other.

In an embodiment, the flexible display device DD may include a plurality of areas defined according to operation types, respectively. In such an embodiment, the flexible display device DD may include a bending area BA bendable on the basis of a bending axis BX and a non-bending area NBA-1 and NBA-2 that is flat and not bent. In such an embodiment, the flexible display device DD may include at least one bending area BA and at least one non-bending area NBA-1 and NBA-2. Although an embodiment where one bending area BA and two non-bending areas NBA-1 and NBA-2 are defined is shown in FIG. 1, embodiments of the invention are not limited thereto. In an alternative embodiment, the flexible display device DD may include a plurality of bending areas BA. In such an embodiment, the flexible display device DD may include three or more non-bending areas.

In an embodiment of the flexible display device DD, the bending area BA and the non-bending areas NBA-1 and NBA-2 may be connected to each other. In one embodiment of the flexible display device DD, for example, the non-bending areas NBA-1 and NBA-2 may be disposed on opposing sides with respect to the bending area BA, as shown in FIG. 1.

In an embodiment, as illustrated in FIG. 1, the display surface IS of the flexible display device DD may be divided into a plurality of areas. The flexible display device DD may include a display area DD-DA on which the image IM is displayed and a non-display area DD-NDA disposed adjacent to the display area DD-DA. The non-display area DD-NDA may be an area on which the image IM is not displayed. FIG. 1 illustrates icons of applications and a clock window as an example of the image IM. The display area DD-DA may have a rectangular shape. The non-display area DD-NDA may surround the display area DD-DA. However, embodiments of the invention are not limited thereto. In such embodiments, that shape of the display area DD-DA and the non-display area DD-NDA may be variously modified.

Referring to FIG. 2, an embodiment of the flexible display device DD may include a display panel DP and a window member WP disposed on the display panel DP. The display panel DP may display an image on a front surface or output an image from the front surface. The display panel DP may out the image in a direction of the third directional axis DR3. In one embodiment, for example, the display panel DP may be an organic light emitting display panel. However, embodiments of the invention are not limited thereto. In one alternative embodiment, for example, the display panel DP may be a liquid crystal display panel, a plasma display panel, an electrophoretic display panel, a microelectromechanical system ("MEMS") display panel, or an electrowetting display panel.

In an embodiment, the display panel DP may be a flexible display panel. The display panel DP may include a flexible substrate. Herein, "flexible" may represent bendable characteristics and may include not only a structure completely bent and folded but also a structure that is bent in a several nanometer (nm) level.

Referring to FIG. 2, the display panel DP may include a bending portion DP-BA corresponding to the bending area BA of the flexible display device DD, and a non-bending portion DP-NBA1 and DP-NBA2 corresponding to the non-bending area NBA-1 and NBA-2 of the flexible display device DD. The bending portion DP-BA and the non-bending portion DP-NBA1 and DP-NBA2 of the display panel DP may be connected to each other. In an embodiment, the non-bending portion DP-NBA1 and DP-NBA2 of the display panel DP may be provided in plurality. In one embodiment, for example, the non-bending portion DP-NBA1 and DP-NBA2 of the display panel DP may include a first non-bending portion DP-NBA1 connected to an end of the bending portion DP-BA and a second non-bending portion DP-NBA2 connected to an opposing end of the bending portion DP-BA.

In an embodiment, as shown in FIG. 2, the non-bending portion DP-NBA1 and DP-NBA2 of the display panel DP may be disposed on opposing sides of the bending portion DP-BA with respect to the bending portion DP-BA, respectively. The non-bending portion DP-NBA1 and DP-NBA2 of the display panel DP may be symmetric to each other with respect to the bending portion DP-BA. However, embodiments of the invention are not limited hereto. In one alternative embodiment, for example, the non-bending portion DP-NBA1 and DP-NBA2 of the display panel DP may be disposed on only one side of the bending portion DP-BA. In an embodiment, where the bending portion DP-BA is disposed between the non-bending portions DP-NBA1 and DP-NBA2 of the display panel DP, the bending portion DP-BA maybe biased (e.g., disposed to be closer) to one side of the non-bending portions DP-NBA1 and DP-NBA2. In such an embodiment, the first non-bending portion DP-NBA1 and the second non-bending portion DP-NBA2 have surface areas different from each other.

An embodiment of the flexible display device DD in FIGS. 1 to 3B may be bent (e.g., folded) with respect to the bending axis BX in a first mode and spread (e.g., unfolded) in a second mode. In the first mode, the window member WP may be disposed closer to the bending axis than the display panel DP.

FIG. 3A is a perspective view illustrating an embodiment of the flexible display device DD in a folded state, and FIG. 3B is a cross-sectional view taken along line II-II' of FIG. 3A. FIGS. 3A and 3B are views illustrating an embodiment of the display device in an in-folding state where the display surface IS thereof faces inside. That is, FIGS. 3A and 3B are perspective views illustrating a bent state in the first mode.

In an embodiment, as shown in FIGS. 4A and 4B, the flexible display device DD may be bent with respect to the bending axis BX in a third mode and spread in a fourth mode. In the third mode, the display panel DP may be disposed closer to the bending axis than the window member WP.

FIG. 4A is a perspective view an embodiment of the flexible display device DD in a folded state, and FIG. 4B is a cross-sectional view taken along line of FIG. 4A. FIGS. 4A and 4B are views illustrating an embodiment of the display device in an out-folded state where the display surface IS thereof is exposed to an outside. That is, FIGS. 4A and 4B are perspective views illustrating a bent state in the third mode.

In an embodiment, as shown in FIG. 3B or 4B, the bending area BA of the flexible display device DD may have a radius of curvature BR equal to or greater than about 1 millimeter (mm) and equal to or less than about 5 mm. In such an embodiment, the radius of curvature BR may rea radius of curvature defined based on an inside surface of the bending area BA in a bent or folded state. In an embodiment of the flexible display device DD, when the flexible display device DD is bent in the first mode as in FIGS. 3A and 3B, the radius of curvature BR may represent a radius of curvature defined based on an outer surface of the window member WP disposed inside in the folded state, and, in an embodiment of the flexible display device DD, when the flexible display device DD is bent in the second mode as shown in FIGS. 4A and 4B, the radius of curvature BR may represent a radius of curvature defined based on an outer surface of the display panel DP disposed inside in the folded state. In one embodiment of the flexible display device DD, for example, the radius of curvature BR may be equal to or greater than about 3 mm and equal to or less than about 5 mm.

In an embodiment, the radius of curvature BR of the bending area BA of the flexible display device DD may be equal to or greater than about 1 mm, and may be determined in consideration of a minimum thickness of each of the display panel DP and the window member WP. If the radius of curvature BR of the bending area BA of the flexible display device DD is greater than about 5 mm, the flexible display device DD in the folded state may increase in volume or have a thick thickness.

An embodiment of the flexible display device DD a may be configured in a way such that the operation modes illustrated only in FIGS. 1 and 3A or FIGS. 1 and 4A are repeated. However, embodiments of the invention are not limited thereto. In such embodiments, the bending area BA may be defined in correspondence to an operation type of the flexible display device DD by a user. In such embodiments, the surface area of the bending area BA may be variously determined according to the radius of curvature BR.

Referring to FIGS. 1 to 4B, an embodiment of the flexible display device DD may include the display panel DP capable of being deformed into a bent shape with respect to the bending axis BX extending in one direction or including the bending area BA having a bent shape, and a window member WP disposed on the display panel DP. Although the one direction that is the extension direction of the bending axis BX is indicated by the second directional axis DR2 in FIGS. 1 to 4B, embodiments of the invention are not limited thereto. In such embodiments, the extension direction of the bending axis BX may be changed according to a deformation shape of the flexible display device DD.

Referring to FIGS. 1 to 4B, an embodiment of the flexible display device DD includes the window member WP disposed on the display panel DP. In such an embodiment, although not shown in the drawings, a touch sensing unit (not shown) may be further disposed on the display panel DP. The touch sensing unit (not shown) may be disposed between the display panel DP and the window member WP.

The touch sensing unit (not shown) may be provided as a separate member on the display panel DP or directly provided on the display panel DP. Herein, a term "directly provided" represents formed through a continuous process without using a separate member such as an adhesive member. In one embodiment, for example, where the display panel DP is an organic light emitting display panel, the touch sensing unit (not shown) may be directly disposed on the organic light emitting display panel. In such an embodiment, the touch sensing unit (not shown) may be directly disposed on an encapsulation layer of the organic light emitting display panel.

In such an embodiment, the window member WP may protect the display panel DP and provide an input surface to a user. In an embodiment, where the flexible display device DD includes the touch sensing unit (not shown), the touch sensing unit (not shown) may be disposed between display panel DP and the window member WP.

In an embodiment, the window member WP may include a laminated glass provided by attaching two glass substrates to each other. The window member WP may include a first glass substrate HW-1 and a second glass substrate HW-2, which face each other, with a bonding layer AP disposed therebetween. The first glass substrate HW-1 and the second glass substrate HW-2 may be a tempered glass substrate. In one embodiment, for example, each of the first glass substrate HW-1 and the second glass substrate HW-2 may be a tempered glass substrate that is treated by a physical strengthening method or a chemical strengthening method using an ion-exchange method.

Each of the first glass substrate HW-1 and the second glass substrate HW-2 may have a thickness equal to or greater than about 30 micrometers (μm) and equal to or less than about 50 μm. If each of the first glass substrate HW-1 and the second glass substrate HW-2 has a thickness less than about 30 μm, the window member WP may decrease in impact resistance for protecting the display panel DP. Also, if each of the first glass substrate HW-1 and the second glass substrate HW-2 has a thickness greater than about 50 μm, the window member WP may be difficult to be applied to the bending area BA of the flexible display device DD as a repulsive force of the window member WP with respect to the bending increases.

In an embodiment of the flexible display device, the first glass substrate HW-1 and the second glass substrate HW-2, which are included in the window member WP, may have a same thickness as each other. Alternatively, the first glass substrate HW-1 and the second glass substrate HW-2 may have thicknesses different from each other.

A bonding layer AP may be disposed between the first glass substrate HW-1 and the second glass substrate HW-2. The bonding layer AP may serve to couple the first glass substrate HW-1 and the second glass substrate HW-2 to each other and also serve to adjust the bending stress and the impact resistance of the laminated glass in which the first glass substrate HW-1 and the second glass substrate HW-2 are laminated.

The bonding layer AP may include or be made of a polyurethane resin. In an embodiment, the bonding layer AP may include a first bonding part AP-F overlapping the bending area BA and a second bonding part AP-H overlapping the non-bending area NBA-1 and NBA-2. In such an embodiment, the first bonding part AP-F of the bonding layer AP may be disposed in correspondence to the bending part DP-BA of the display panel DP, and the second bonding part AP-H may be disposed in correspondence to the non-bending area NBA-1 and NBA-2 of the display panel DP.

In an embodiment, the first bonding part AP-F and the second bonding part AP-H may have mechanical properties different from each other. In an embodiment, the first bonding part AP-F may have a modulus less than that of the second bonding part AP-H. In one embodiment, for example, the first bonding part AP-F may have a modulus value equal to or greater than about 0.1 megapascal (MPa) and equal to or less than about 100 MPa. In such an embodiment, the second bonding part AP-H may have a modulus value greater than about 100 MPa and equal to or less than about 700 MPa.

An embodiment of the flexible display device DD includes the first bonding part AP-F and the second bonding part AP-H, which have different modulus values, as the bonding layer AP of the window member WP, such that the flexible display device DD may be easily deformed in the bending area BA and have high or effective impact resistance with respect to an external impact.

In an embodiment, since the laminated glass is used as the window member WP, the flexible display device DD may have the higher impact resistance in comparison with a case where a single glass substrate is used. Also, in an embodiment, the window member WP may have increased flexibility by laminating the glass substrates HW-1 and HW-2 in comparison with a case where a single thick glass substrate is used. In such an embodiment, each of the glass substrates HW-1 and HW-2 used in the window member WP may have a thickness less than that of the single glass substrate.

In an embodiment of the flexible display device DD, the first bonding part AP-F has a modulus value relatively less than that of the second bonding part AP-H, and the first bonding part AP-F has a repulsive force with respect to deformation such as bending in comparison with the second bonding part AP-H. Thus, the window member WP including the first bonding part AP-F disposed in correspondence to the bending area BA may be easily deformed in the bending area BA. In such an embodiment, the window member WP including the second bonding part AP-H disposed in correspondence to the non-bending area NBA-1 and NBA-2 may have improved impact resistance to protect the display panel DP in the non-bending area NBA-1 and NBA-2.

In an embodiment, as the window member WP includes the first bonding part AP-F having the relatively low modulus value to have flexibility, and the second bonding part AP-H connected to the first bonding part AP-F and having the higher modulus value than the first bonding part AP-F to support the glass substrates HW-1 and HW-2

In an embodiment, the window member WP may further include a surface protective layer (not shown). In one embodiment, for example, the window member WP may further include a functional protective layer such as a hard coating layer and an anti-fingerprint layer. In an embodiment, the window member WP may further include an anti-scattering layer (not shown). The anti-scattering layer (not shown) may serve to hold the damaged glass substrates HW-1 and HW-2 when the glass substrates HW-1 and HW-2 of the window member WP are broken. The anti-scattering layer (not shown) may be disposed between the display panel DP and the window member WP. In one embodiment, for example, the anti-scattering layer (not shown) may be disposed below the first glass substrate HW-1 and contain a polyurethane resin.

In an embodiment, the first bonding part AP-F may have a module equal to or greater than about 0.1 MPa and equal to or less than about 100 MPa. In one embodiment, for example, the first bonding part AP-F may have a module equal to or greater than about 50 MPa and equal to or less than about 100 MPa. If the first bonding part AP-F has a modulus less than about 0.1 MPa, since the first bonding part AP-F increases in flexibility, the first bonding part AP-F may not be uniformly deformed over the entire bending area BA, and a portion, in which micro-deformation occurs, increases in the first bonding part AP-F, such that the window member WP may not have desired appearance quality in the bending area BA. Also, if the first bonding part AP-F has a modulus greater than about 100 MPa, a repulsive force may increase in the bending area BA. In such an embodiment, where the first bonding part AP-F has a modulus equal to or greater than about 0.1 MPa and equal to or less than about 100 MPa, the bending repulsive force may be equal to or less than about 20 newtons (N) in case of a radius of curvature of about 3 mm to about 5 mm.

In an embodiment, the second bonding part AP-H may have a module greater than about 100 MPa and equal to or less than about 700 MPa. In one embodiment, for example, the second bonding part AP-H may have a module equal to or greater than about 300 MPa and equal to or less than about 700 MPa. If the second bonding part AP-H has a modulus equal to or less than about 100 MPa, the bonding layer AP including the second bonding part AP-H may not have sufficient strength, so that the impact resistance thereof with respect to an external impact may be reduced. Also, if the second bonding part AP-H has a modulus greater than about 700 MPa, a total modulus value of the bonding layer AP including the second bonding part AP-H and the window member WP including the bonding layer AP may increase, such that the window member WP may become brittle. In such an embodiment, where the modulus is greater than about 100 MPa and equal to or less than about 700 MPa, the window member may have strength sufficient not to be damaged when a pen is dropped at a height equal to or greater than about 20 centimeters (cm).

In an embodiment, the first bonding part AP-F that is included in the window member WP may have a restoration rate equal to or greater than about 70% and equal to or less than about 100%. If a length of a specimen for evaluating a restoration rate is L, the restoration rate may be evaluated by a ratio of a length restored when an applied tensile force is removed after the specimen is elongated into 2L that is two times of the original length. For example, the restoration rate may be defined as below.

Restoration rate (%)={(2L−L')/(2L−L)}×100

In the above equation on restoration rate evaluation, L denotes an initial length of a specimen, and L' denotes a length of the specimen after a tensile force is removed.

In an embodiment, where the first bonding part AP-F is made of a polyurethane resin having a relatively small modulus and a high restoration rate equal to or greater than 70%, the first bonding part AP-F may be deformed in the bending area BA while the window member WP has a small repulsive force.

In an embodiment of the flexible display device DD, the first bonding part AP-F may have a width overlapping the bending area BA. In one embodiment, for example, when the radius of curvature BR of the bending area BA is denoted by "R", the first bonding part AP-F may have a width equal to or greater than RR. In such an embodiment, the first bonding part AP-F may have a width equal to or greater than πR with respect to the radius of curvature BR of "R" to cover the bending area BA. Meanwhile, referring to FIGS. 1 to 4B, the width of the first bonding part AP-F may be a length thereof in one direction perpendicular to the extension direction of the bending axis BX, i.e., a width in the first directional axis DR1.

In an embodiment, the bonding layer AP may have a thickness equal to or greater than about 5 μm and equal to or less than about 30 μm. If the thickness of the bonding layer AP is less than about 5 μm, the bonding layer AP may not have an adhesive force enough to fix the two glass substrates HW-1 and HW-2. Also, if the thickness of the bonding layer AP is greater than about 30 μm, the window member WP may have a great thickness and increase in bending repulsive force when the display device is deformed.

Figure 5A:
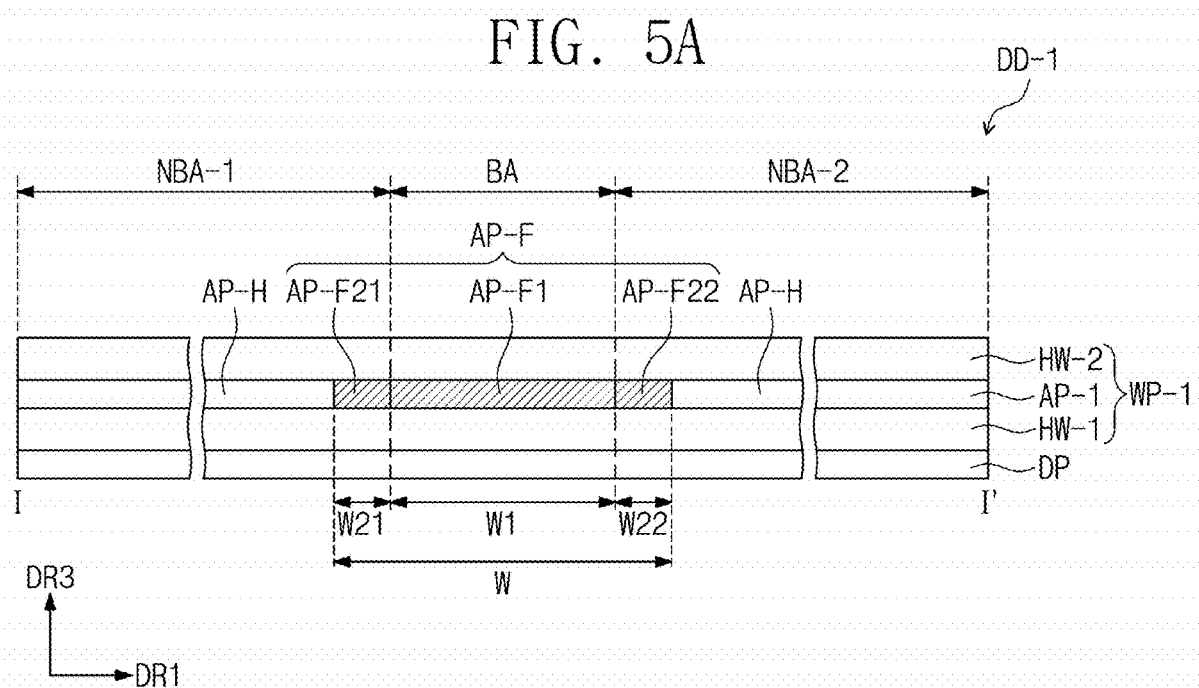
FIG. 5A is a cross-sectional view illustrating an embodiment of the flexible display device in an unbent state.
Figure 5B:
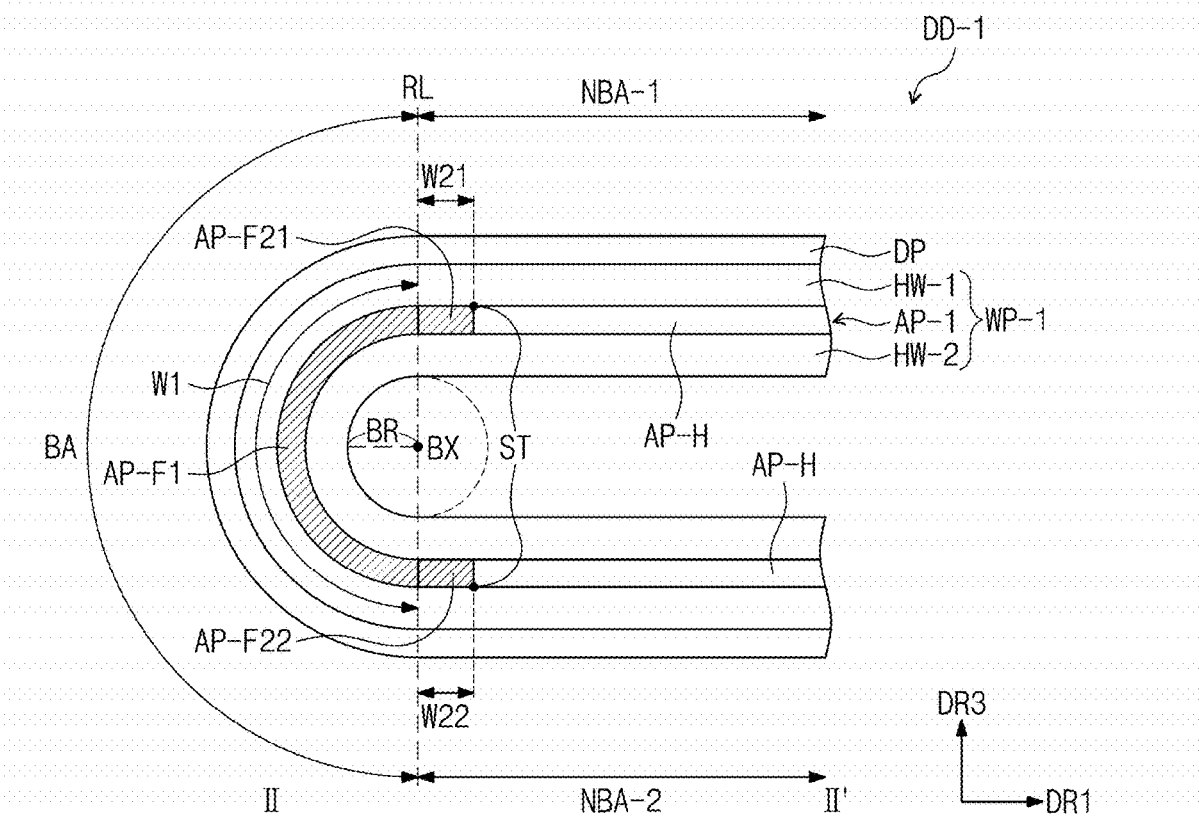
FIG. 5B is a cross-sectional view illustrating an embodiment the flexible display device in a bent state.

FIG. 5A is a cross-sectional view illustrating an embodiment of a flexible display device DD-1 in an unfold state, and FIG. 5B is a cross-sectional view illustrating a portion of the flexible display device DD-1 in FIG. 5A in a bent state. FIG. 5A may be a view showing a portion corresponding to a cross-section taken along line I-I' in the perspective view of the flexible display device DD in FIG. 1. Also, FIG. 5B may be a view showing a state in which the flexible display device DD-1 is bent as shown in FIGS. 3A and 3B. FIG. 5B may be a view illustrating a portion corresponding to a cross-section taken along line II-If in FIG. 3A. Hereinafter, for convenience of description, different elements or features of an embodiment of the flexible display device DD-1 in FIGS. 5A and 5B, different from those of embodiments of the flexible display device described above with reference to FIGS. 1 to 4B will be described in detail, and any repetitive detailed description of a same or like element will be omitted.

Referring to FIGS. 5A and 5B, in an embodiment of the flexible display device DD-1, the first bonding part AP-F of the window WP-1 may include a first sub-bonding portion AP-F1 overlapping the bending area BA and a second sub-bonding portions AP-F21 and AP-F22 extending from the first sub-bonding portion AP-F1 and overlapping the non-bending area NBA-1 and NBA-2. In such an embodiment, the first bonding part AP-F of the bonding layer AP-1 may cover the entire bending area BA and extending until a portion of the non-bending area NBA-1 and NBA-2 adjacent to the bending area BA.

In an embodiment, the first bonding part AP-F may have a width W in one direction perpendicular to the extension direction of the bending axis BX. Referring to FIG. 5A, the width W of the first bonding part AP-F may be a length in an extension direction of the first directional axis DR1 when the flexible display device DD-1 is an unfolded or spread state.

In an embodiment, the width W of the first bonding part AP-F may be a sum of a width W1 of the first sub-bonding portion AP-F1 overlapping the bending area BA and widths W21 and W22 of the second sub-bonding portions AP-F21 and AP-F22 extending to both side of the first sub-bonding portion AP-F1 with respect to the first sub-bonding portion AP-F1, respectively.

In an embodiment, the width W of the first bonding part AP-F may satisfy the following inequation: πR≤W≤3×(πR).

In the inequation above, R denotes the radius of curvature BR of the bending area BA of the flexible display device in a folded state, and W denotes the width of the first bonding part AP-F.

In such an embodiment, the first bonding part AP-F may have the width at least equal to or greater than RR to cover the bending area BA and may extend until the non-bending area NBA-1 and NBA-2 while having the width maximally equal to or less than 3×(πR). In such an embodiment, the maximum width of the first bonding part AP-F may be a width of the first bonding part AP-F extended to a point at which the bonding layer AP-1 has a shear strain of about zero (0) when the flexible display device DD-1 is bent.

FIG. 6 is a graph showing a value of a shear strain versus a distance spaced from the bending axis BX. FIG. 6 exemplarily illustrates variations in shear strain values of the bonding layer AP-1 versus a relative distance from the bending axis BX when an embodiment of the flexible display device DD-1 is bent like FIG. 5B. FIG. 6 shows the shear strain values when the radius of curvature BR is about 3 mm in an embodiment of the flexible display device DD-1 shown in FIG. 5B.

Referring back to FIG. 5B, a distance indicated in an X-axis in the graph of FIG. 6 may be a shortest distance from an imaginary line RL extending in one direction perpendicular to the bending axis BX while passing through the bending axis BX to an edge of the first bonding part AP-F. That is, the imaginary line RI, may be parallel to the third directional axis DR3 while passing through the bending axis. A point indicated by a reference symbol "ST" in FIGS. 5B and 6 is a point at which the shear strain becomes zero (0). The second sub-bonding portions AP-F21 and AP-F22 included in the first bonding part AP-F may extend until the "ST" point. The distance indicated in the X-axis in FIG. 6 may indicate the widths of the second sub-bonding portions AP-F21 and AP-F22 extending from one side of the first sub-bonding portion AP-F1. Here, the distance corresponding to the "ST" point may be the widths W21 and W22 of the second sub-bonding portions AP-F21 and AP-F22 in FIGS. 5A and 5B.

Referring to FIG. 6, the "ST" point may have a distance spaced about 8.4 mm from the imaginary line RL perpendicular to the bending axis BX. Here, when the radius of curvature BR of the bending area BA is about 3 mm, and the widths W21 and W22 of the second sub-bonding portions AP-F21 and AP-F22 provided on the opposing sides of the first sub-bonding portion AP-F1 with respect to the first sub-bonding portion AP-F1 are the same as each other, the width W of the first sub-bonding portion AP-F may be about 26 mm, which is about 2.8 times greater than a width when the first bonding part AP-F overlapping only the bending area BA is provided. Accordingly, the graph in FIG. 6 may show that a range of the width of the first bonding part AP-F satisfies the inequation described above.

Hereinafter, an embodiment of a method for manufacturing a flexible display device will be described with reference to FIGS. 7 and 8A to 8E. Hereinafter, the same or like elements of the flexible display device shown in FIGS. 7 and 8A to 8E as those described above with reference to FIGS. 1 to 6 have been labeled with the same reference characters.

An embodiment of the method for manufacturing a flexible display device may include a process S100 of providing a display panel including a bending part and a non-bending part, a process of providing a window member including a first glass substrate and a second glass substrate, which face each other, with a bonding layer disposed therebetween, and a process S300 of arranging the window member on the display panel. In such an embodiment, the method for manufacturing a flexible display device may further include a process S400 of bending the display panel and the window member. Alternatively, the process S400 of bending the display panel and the window member may be omitted from the processes of the method for manufacturing a flexible display device. In such an embodiment, the flexible display device, in which the display panel and the window are laminated, may be used while being bent or spread in a repeated manner when used.

In an embodiment of the method for manufacturing the flexible display device, the display panel DP may include a bending part DP-BA and a non-bending parts DP-NBA1 and DP-NBA2. Referring to FIG. 8D, although an embodiment of the flexible display device includes the bending part DP-BA and the two non-bending parts DP-NBA1 and DP-NBA2 disposed on both side of the bending part DP-BA, respectively, embodiments of the invention are not limited thereto. In such embodiments, the number and positions of the bending part DP-BA and the non-bending parts DP-NBA1 and DP-NBA2 may be varied modified according to the design of the flexible display device DD.

In an embodiment, as shown in FIG. 7, the process of providing the window member may include a process S210 of providing a first bonding resin and a second bonding resin on a first glass substrate, a process S230 of providing a second glass substrate on the provided first and second bonding resins, and a process S250 of curing the first and second bonding resins to form a bonding layer.

Figure 8A:
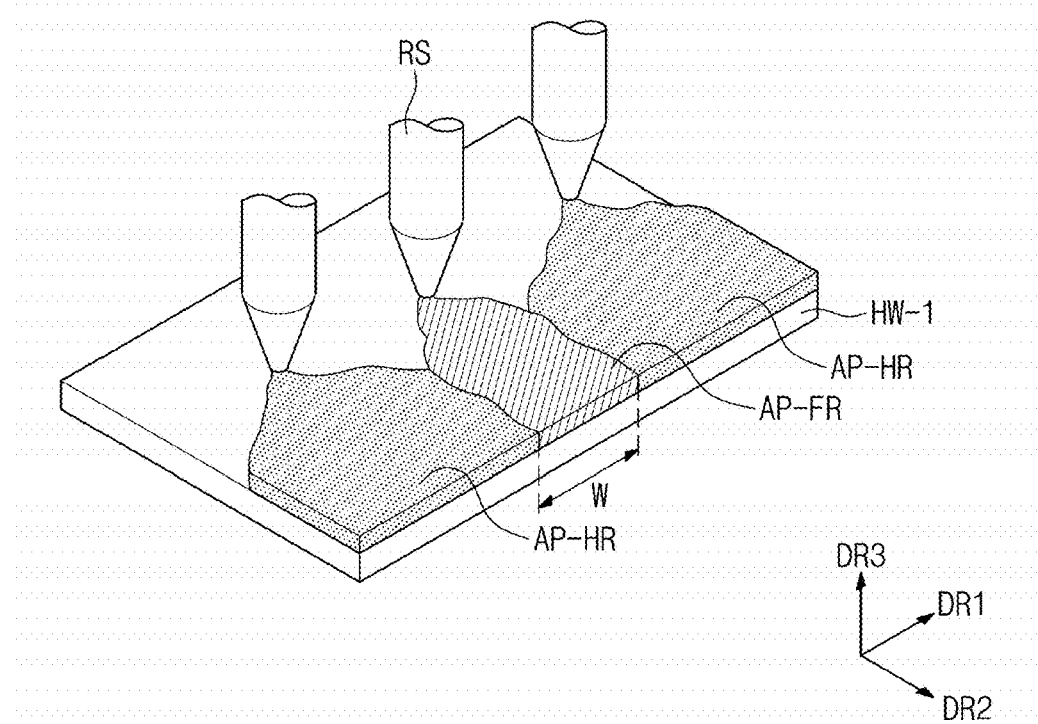
Figure 8B:
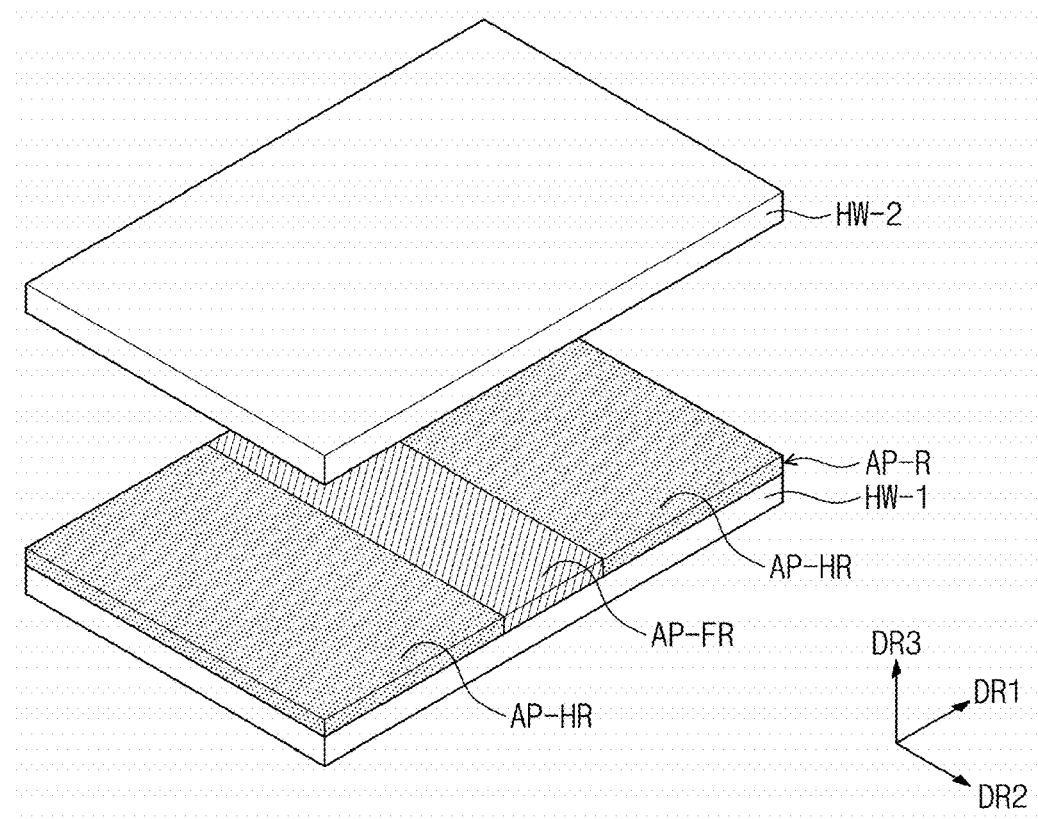
Figure 8C:
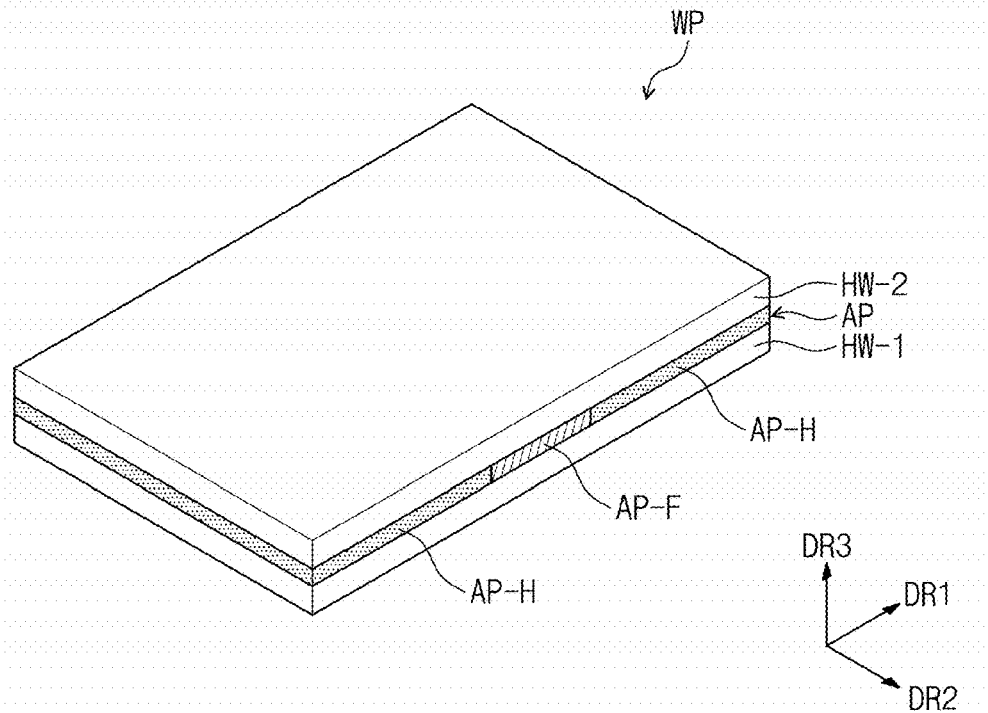
Figure 8D:
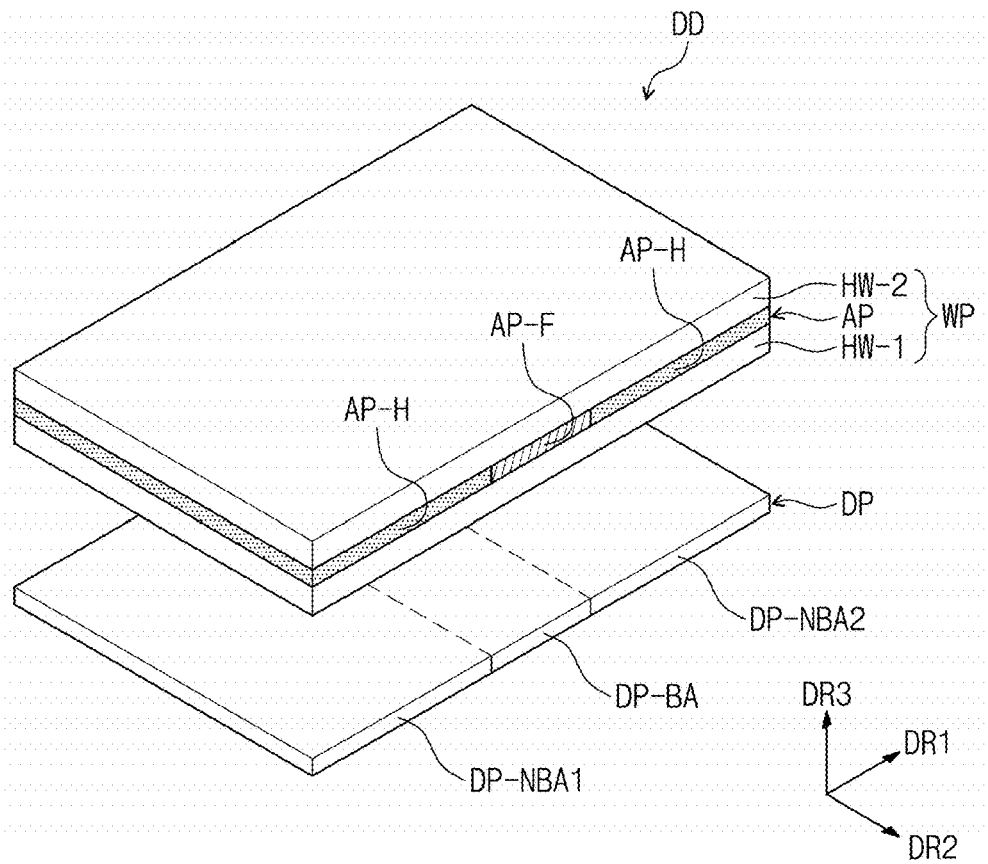

FIGS. 8A to 8C are schematic views sequentially illustrating processes of providing the window member in the method for manufacturing the flexible display device according to an embodiment. FIG. 8A is a view illustrating an embodiment of a process S210 of providing the first and second bonding resins on the first glass substrate. Referring to FIG. 8A, a first bonding resin AP-FR and a second bonding resin AP-HR are provided on a prepared first glass substrate HW-1 by using a resin supply nozzle RS. The process S210 of providing the first and second bonding resins on the first glass substrate may include supplying the first bonding resin AP-FR and the second bonding resin AP-HR on one surface of the first glass substrate HW-1 by using the supply nozzle RS, and forming the supplied first bonding resin AP-FR and second bonding resin AP-HR into a layer having a predetermined thickness by using at least one of various coating methods, e.g., a doctor-blade coating method.

In the process S210 of providing first and second bonding resins on the first glass substrate, the first bonding resin AP-FR and the second bonding resin AP-HR may be substantially simultaneously provided in a same process. Alternatively, the first bonding resin AP-FR may be firstly provided on the first glass substrate HW-1, and then the second bonding resin AP-HR may be provided on the first glass substrate HW-1. The first bonding resin AP-FR may be provided to satisfy the inequation described above. In such an embodiment, when the flexible display device according to an embodiment has the radius of curvature of R, the first bonding resin AP-FR may be provided on the first glass substrate HW-1 with a thickness equal to or greater than about RR and equal to or less than about $3 \times (\pi R)$.

In an embodiment, each of the first bonding resin AP-FR and the second bonding resin AP-HR may include a polyol and an isocyanate. In such an embodiment, each of the first bonding resin AP-FR and the second bonding resin AP-HR may include different kinds of polyol. Alternatively, each of the first bonding resin AP-FR and the second bonding resin AP-HR may include a same kind of polyol and be different only in content ratio between polyol and isocyanate.

In an embodiment, the polyol used in the first bonding resin AP-FR and the second bonding resin AP-HR may include at least one of polycarbonate polyol, polyether polyol, polyester polyol, and acryl polyol. In an embodiment, the polyol used in the first bonding resin AP-FR and the second bonding resin AP-HR may have a predetermined number of functional groups, e.g., equal to or greater than about 2 and equal to or less than about 4. In one embodiment, for example, the polyol used in the first bonding resin AP-FR and the second bonding resin AP-HR may be polycarbonate polyol and have two functional groups.

In an embodiment, the isocyanate used in the first bonding resin AP-FR and the second bonding resin AP-HR may be aliphatic diisocyanate. In an embodiment, each of the first bonding resin AP-FR and the second bonding resin AP-HR may use the aliphatic diisocyanate to minimize a yellowing phenomenon when the bonding layer is formed. In one embodiment, for example, the isocyanate may be isophorone diisocyanate ("IPDI"), or hexamethylene diisocyanate ("HDI").

The polyol and isocyanate in the first bonding resin AP-FR may be mixed at a weight ratio of about 100:5 to about 100:40.

In an embodiment, the first bonding resin AP-FR and the second bonding resin AP-HR may include polyols having molecular weights different from each other. The polyol included in first bonding resin AP-FR may have a mean molecular weight less than that of the polyol included in the second bonding resin AP-HR. The molecular weight of the polyol included in first bonding resin AP-FR may be equal to or greater than about 500 and equal to or less than about 3000. In one embodiment, for example, the mean molecular weight of the polyol included in first bonding resin AP-FR may be equal to or greater than about 500 and equal to or less than about 1000. Here, the mean molecular weight of the polyol may represent a mean value of the molecular weight of the polyols included in the first bonding resin AP-FR.

In the process S210 of providing the first and second bonding resins on the first glass substrate, each of the first bonding resin and the second bonding resin may be provided in film-type. In one embodiment, for example, each of the first bonding resin and the second bonding resin may be provided in a pre-cured film type including the polyol and the isocyanate. In such an embodiment, the first bonding resin and the second bonding resin may not be provided in liquid state but be provided in non-cured film-type including the polyol and the isocyanate, to be attached on the first glass substrate HW-1. In one embodiment, for example, a single piece of film type in a state in which the second bonding resin is provided on opposing sides with respect to the first bonding resin may be provided, or the first bonding resin and the second bonding resin may be provided in correspondence to the bending part and the non-bending part of the display panel, respectively.

After the process S210 of providing the first and second bonding resins on the first glass substrate, a process S230 of providing the second glass substrate on the first and second bonding resins may be performed. FIG. 8B illustrates a process of providing the second glass substrate HW-2 on the bonding resin layer AP-R including the coated first and second bonding resins AP-FR and AP-HR. In such an embodiment, the bonding resin layer AP-R may be in a non-cured state.

FIG. 8C illustrates the window member WP in which the first glass substrate HW-1 and the second glass substrate HW-2 are attached to each other by the bonding layer AP. As described in FIG. 8B, after providing the second glass substrate HW-2 on the bonding resin layer AP-R including the first and second bonding resins AP-FR and AP-HR, a process S250 of curing the first and second bonding resins to form the bonding layer may be performed. The process S250 of curing the first and second bonding resins to form the bonding layer may be a thermally curing the first and second bonding resins AP-FR and AP-HR to form the bonding layer AP.

In such an embodiment, the process S250 of curing the first and second bonding resins to form the bonding layer may be a process of curing the first bonding resin AP-FR to form the first bonding part AP-F having a first modulus and curing the second bonding resin AP-HR to form the second bonding part AP-H having a second modulus greater than the first modulus. In such an embodiment, the first modulus of the first bonding part AP-F may be equal to or greater than about 0.1 MPa and equal to or less than about 100 MPa, and the second modulus of the second bonding part AP-H may be greater than about 100 MPa and equal to or less than about 700 MPa. Each of the first bonding part AP-F and the second bonding part AP-H may include a polyurethane resin having a different modulus value from each other.

FIG. 8D schematically illustrates a process S300 of arranging the window member on the display panel. Although not shown in the drawing, when the window member WP is provided on the display panel DP, a bonding layer (not shown) may be further provided between the display panel DP and the window member WP. The bonding layer (not shown) may include an optically clear adhesive layer or an optically clear adhesive resin.

In such an embodiment, when the window member WP is arranged on the display panel DP, the first bonding part AP-F of the bonding layer AP may overlap the bending part DP-BA of the display panel DP, and the second bonding part AP-H of the bonding layer AP may overlap the non-bending parts DP-NBA1 and DP-NBA2 of the display panel DP.

An embodiment of the method for manufacturing the flexible display device may further include a process S400 of bending the display panel and the window member. FIG. 8E schematically illustrates a process S400 of bending the display panel and the window member. FIG. 8E may be a view illustrating a process of bending the display panel DP and the window member WP with respect to the bending axis BX extending in one direction. Although the in-folded flexible display device DD that is bent so that the window member WP is disposed closer to the bending axis BX than the display panel DP is illustrated in FIG. 8E, embodiments of the invention are not limited thereto. Alternatively, the process S400 of bending the display panel and the window member may be omitted from the method for manufacturing the flexible display device. The flexible display device manufacture by an embodiment of the method for manufacturing the flexible display device may be provided in a spread state and may be bent with respect to the bending axis BX during usage.

An embodiment of the flexible display device includes the window member including the bonding layer having mechanical properties that are different in the bending area and the non-bending area, such that the repulsive force in the bending area may be minimized, and the high impact resistance with respect to an external impact may be achieved.

An embodiment of the method for manufacturing the flexible display device includes forming the bonding layer by providing the bonding resins having different compositions to the bending part and non-bending part of the display panel, respectively, such that the flexible display device may have a low modulus value to have the desired bending characteristics in the bending area and have a high modulus value to enhance the impact resistance.

In an embodiment, as the window member including the bonding layer having a low modulus value in correspondence to the bending area and a high modulus value in correspondence to the non-bending area is provided, the flexible display device having the low bending stress and the improved impact resistance may be provided.

In an embodiment, as the process of providing the window member including forming the bonding layer by providing the bonding resins having properties different from each other in correspondence to the bending area and the non-bending area, respectively, the flexible display device having the flexibility and the high impact resistance in the bending area may be provided by the method.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A flexible display device having a bending area and a non-bending area, the flexible display device comprising:
   a display panel which displays an image on an front surface; and
   a window member disposed on the front surface of the display panel,
   wherein the window member comprises:
   a first glass substrate disposed on the display panel;
   a second glass substrate disposed on the first glass substrates; and
   a bonding layer disposed between the first glass substrate and the second glass substrate, and the bonding layer attaching the first and second glass substrates each other,
   wherein each of the first glass substrate and the second glass substrate is a tempered glass substrate, and
   wherein the bonding layer comprises:
   a first bonding part overlapping the bending area; and a second bonding part overlapping the non-bending area and having a modulus greater than a modulus of the first bonding part.

2. The flexible display device of claim 1, wherein the modulus of the first bonding part is equal to or greater than 0.1 MPa and equal to or less than 100 MPa, and the modulus of the second bonding part is greater than 100 MPa and equal to or less than 700 MPa.

3. The flexible display device of claim 1, wherein the bonding layer includes a polyurethane resin.

4. The flexible display device of claim 1, wherein the first bonding part has a restoration rate equal to or greater than 70% and equal to or less than 100%.

5. The flexible display device of claim 1, wherein each of the display panel and the window member is bent to have a radius of curvature equal to or greater than 1 mm and equal to or less than 5 mm with respect to a bending axis extending in one direction.

6. The flexible display device of claim 5, wherein
a width of the first bonding part in the one direction perpendicular to an extension direction of the bending axis satisfies the following inequation: $\pi R \leq W \leq 3 \times (\pi R)$,
wherein R denotes the radius of curvature, and W denotes the width of the first bonding part.

7. The flexible display device of claim 1, wherein
the display panel and the window member are bent with respect to a bending axis in a first mode and spread in a second mode, and
the window member is disposed closer to the bending axis than the display panel in the first mode.

8. The flexible display device of claim 1, wherein
the display panel and the window member are bent with respect to a bending axis in a third mode and spread in a fourth mode, and
the display panel is disposed closer to the bending axis than the window member in the third mode.

9. The flexible display device of claim 1, wherein the first bonding part comprises:
a first sub-bonding portion overlapping the bending area; and
a second sub-bonding portion extending from the first sub-bonding portion and overlapping the non-bending area.

10. The flexible display device of claim 1, wherein each of the first glass substrate and the second glass substrate has a thickness equal to or greater than 30 μm and equal to or less than 50 μm.

11. The flexible display device of claim 1, wherein the bonding layer has a thickness equal to or greater than 5 μm and equal to or less than 30 μm.

12. A flexible display device comprising:
a display panel comprising a bending part which is deformable into a bent shape with respect to a bending axis extending in one direction or has the bent shape;
a first glass substrate on the display panel;
an bonding layer disposed directly on the first glass substrate; and
a second glass substrate disposed directly on the bonding layer, and
wherein each of the first glass substrate and the second glass substrate is a tempered glass substrate, and
wherein the bonding layer comprises:

a first bonding part overlapping the bending part and having a first modulus; and
a second bonding part non-overlapping the bending part and having a second modulus greater than the first modulus.

13. A method for manufacturing a flexible display device, the method comprising:
providing a display panel comprising a bending part and a non-bending part;
providing a window member comprising a first glass substrate, a second glass substrate disposed opposite to the second glass substrate, and a bonding layer disposed between the first glass substrate and the second glass substrate; and
arranging the window member on the display panel,
wherein the providing the window member comprises:
providing a first bonding resin and a second bonding resin directly on the first glass substrate;
arranging the second glass substrate on the first and second bonding resins; and
curing the first and second bonding resins to form the bonding layer between the first glass substrate and the second glass substrate,
wherein
the first bonding resin is provided in correspondence to the bending part,
the second bonding resin is provided in correspondence to the non-bending part,
each of the first bonding resin and the second bonding resin includes a polyol and a isocyanate, and
the polyol in the first bonding resin has a mean molecular weight less than a mean molecular weight of the polyol in the second bonding resin, and
wherein each of the first glass substrate and the second glass substrate is a tempered glass substrate.

14. The method of claim 13, wherein the mean molecular weight of the polyol in the first bonding resin is equal to or greater than 500 and equal to or less than 1000.

15. The method of claim 13, wherein each of the first bonding resin and the second bonding resin provided on the first glass substrate is in a pre-cured film type.

16. The method of claim 13, wherein the curing the first bonding resin and the second bonding resin to form the bonding layer comprises thermally curing the first bonding resin and the second bonding resin between the first glass substrate and the second glass substrate.

17. The method of claim 13, wherein the curing the first bonding resin and the second bonding resin to form the bonding layer comprises:
curing the first bonding resin to form a first bonding part having a first modulus; and
curing the second bonding resin to form a second bonding part having a second modulus greater than the first modulus.

18. The method of claim 17, wherein
the first modulus is equal to or greater than 0.1 MPa and equal to or less than 100 MPa, and
the second modulus is greater than 100 MPa and equal to or less than 700 MPa.

19. The method of claim 13, further comprising:
bending the display panel and the window member with respect to a bending axis extending in one direction.

* * * * *